(12) United States Patent
Tamezane (10) Patent No.: US 7,944,178 B2
(45) Date of Patent: May 17, 2011

(54) FULLY-CHARGED BATTERY CAPACITY DETECTION METHOD

(75) Inventor: Shigeto Tamezane, Kakogawa (JP)

(73) Assignee: Sanyo Electric Co., Ltd., Osaka (JP)

( * ) Notice: Subject to any disclaimer, the term of this patent is extended or adjusted under 35 U.S.C. 154(b) by 588 days.

(21) Appl. No.: 12/076,629

(22) Filed: Mar. 20, 2008

(65) Prior Publication Data

US 2008/0238371 A1    Oct. 2, 2008

(30) Foreign Application Priority Data

Mar. 26, 2007   (JP) ................. 2007-079952

(51) Int. Cl.
*H02J 7/00* (2006.01)
*G01R 31/36* (2006.01)

(52) U.S. Cl. .................. 320/132; 320/134; 702/63

(58) Field of Classification Search .............. 320/132; 702/63
See application file for complete search history.

(56) References Cited

U.S. PATENT DOCUMENTS

| 6,441,419 B1 * | 8/2002 | Johnson et al. ............. 257/296 |
| 7,406,389 B2 * | 7/2008 | Emori et al. ................... 702/85 |
| 2002/0195999 A1 * | 12/2002 | Kimura et al. ............... 320/134 |

FOREIGN PATENT DOCUMENTS

| EP | 1 314 992 | 5/2003 |
| EP | 1 555 537 | 7/2005 |
| EP | 1 632 781 | 3/2006 |
| JP | 06-242193 | 9/1994 |
| JP | 029505 | 2/1996 |
| JP | 2002-236154 | 8/2002 |
| WO | 2006/098594 | 9/2006 |
| WO | 2006/121289 | 11/2006 |

OTHER PUBLICATIONS

European Search Report issued Feb. 15, 2011 in European Application No. 08004936.4 (in English).

* cited by examiner

*Primary Examiner* — M'baye Diao
(74) *Attorney, Agent, or Firm* — Wenderoth, Lind & Ponack, L.L.P.

(57) ABSTRACT

A fully-charged battery capacity detection method includes a capacity variation detection step, an open-circuit voltage detection step, a remaining capacity determination step, a remaining capacity variation rate calculation step, and a fully-charged capacity calculation step. The capacity variation detection step calculates a capacity variation value of a battery between first detection timing and second detection timing. The open-circuit voltage detection step detects first and second open-circuit voltages of the battery at the first and second detection timing, respectively. The remaining capacity determination step determines first and second remaining capacities of the battery based on the first and second open voltages, respectively. The remaining capacity variation rate calculation step calculates a remaining capacity variation rate based on the difference between the first and second remaining capacities. The fully-charged capacity calculation step calculates a fully-charged capacity of the battery based on the remaining capacity variation rate and the capacity change value.

15 Claims, 7 Drawing Sheets

FULLY-CHARGED BATTERY CAPACITY DETECTION METHOD

BACKGROUND OF THE INVENTION

1. Field of the Invention

The present invention relates to a method for detecting a fully-charged battery capacity, which decreases with increasing the number of charging/discharging operation cycles.

2. Description of the Related Art

The fully-charged capacity (Ahf) of a battery decreases with time and with increasing the number of charging/discharging operation cycles. The fully-charged/discharged capacity (Ahf) is the capacity of a battery that can be discharged from a fully charged state to a fully-discharged state. Batteries remarkably deteriorate when over-charged or over-discharged. For this reason, in order to suppress deterioration, a battery is used so that the capacity of the battery falls within a range around a predetermined remaining capacity (SOC [%]) relative to the fully-charged capacity (Ahf). Accordingly, it is important to accurately detect the fully-charged capacity (Ahf), which decreases with time. If the detection of the fully-charged capacity (Ahf) has an error, this error may cause battery deterioration. The reason is that, even in the case where charging/discharging operation is controlled so that the capacity of the battery falls within the range around a predetermined ratio of the remaining capacity (SOC [%]) relative to the fully-charged capacity (Ahf), the remaining capacity of the battery may fall within an over-charged or over-discharged range. For example, a battery for vehicles is controlled so that the remaining capacity of the battery falls within a predetermined range that extends around 50%. The remaining capacity (SOC [%]) is determined with reference to the fully-charged capacity (Ahf). If the fully-charged capacity (Ahf) has an error, the remaining capacity (SOC [%]) cannot be controlled to fall within the predetermined range that extends around 50%. For example, when a battery the fully-charged capacity (Ahf) of which is 10 Ah is discharged to a capacity of 5 Ah, the remaining capacity (SOC [%]) is 50%. In the case of a battery the fully-charged capacity (Ahf) of which decreases to 5 Ah, when the capacity (Ah) of the battery is 5 Ah, the remaining capacity (SOC [%]) is 100%. Even in the case where charging/discharging operation is controlled so that the capacity (Ah) of a battery is falls within a range around 5 Ah, if the fully-charged capacity decreases in half from 10 Ah to 5 Ah, the remaining capacity (SOC [%]) will reach 100%. Accordingly, the battery may be brought to the over-charged state, and may remarkably deteriorate. In particular, it is important for a vehicle power supply device to control the remaining capacity (SOC [%]) of a battery in a range around 50% so that the battery can be charged and discharged. The reason is that the battery is discharged to accelerate a vehicle, and is charged by regenerative braking operation to brake the vehicle.

The fully-charged capacity (Ahf) of a battery can be detected by integrating charge capacity amounts that are charged to the battery in the fully-discharged state to the fully-charged state. The fully-charged capacity (Ahf) can be also detected by integrating discharge capacity amounts that are discharged from the battery in the fully-charged state to the fully-discharged state. These methods can accurately detect the fully-charged capacity (Ahf) of the battery. However, these methods have a disadvantage in that the battery is used in remarkably limited conditions. If the battery is brought in the fully-discharged state, the battery cannot provide power. Also, if the battery is brought in fully-charged state, the battery cannot receive power. For example, the battery that is installed in the vehicle is discharged to accelerate the vehicle by means of motor, and is charged by a generator in the regenerative braking operation when the vehicle brakes. Accordingly, if the battery is in the fully-discharged state, the battery cannot accelerate the vehicle. Also, if the battery is in the fully-charged state, the battery cannot be charged in the regenerative braking operation. Not only for the case of vehicles, if a battery is fully discharged to detect the fully-charged capacity (Ahf), there are disadvantages in that discharging operation takes time, and in that the battery in the fully-discharged state cannot be used. Batteries are likely to deteriorate if brought in the fully-charged and fully-discharged ranges. In the methods that bring a battery to the fully-charged and fully-discharged states to detect the fully-charged capacity (Ahf), the detection of the fully-charged capacity (Ahf) may cause deterioration of the battery.

As one method that solves these disadvantages, Japanese Patent Laid-Open Publication No. 2002-236154 discloses a method that detects the deterioration degree of a battery based on the accumulated charging capacity amount, and detects the reduction value of the fully-charged capacity (Ahf) of the battery. Also, Japanese Patent Laid-Open Publication No. 2002-236154 discloses a method that detects the reduction rate of the fully-charged capacity of a battery based on the storage temperature and the remaining capacity of the battery as parameters.

SUMMARY OF THE INVENTION

The method in Japanese Patent Laid-Open Publication No. 2002-236154 can detect the fully-charged capacity without bringing the battery to the fully-charged state or the fully-discharged state. Accordingly, this method does not limit battery conditions but can detect the fully-charged capacity. However, since these methods estimate the reduction degree of the fully-charged capacity based on the accumulated charging capacity amount, or based on the storage temperature and the remaining capacity, there is a disadvantage in that it is difficult to constantly accurately detect the fully-charged capacity of the battery. The reason is that the deterioration of batteries complicatedly varies with various external conditions.

The present invention has been developed for solving the disadvantages. It is an important object of the present invention is to provide a method capable of accurately detecting the fully-charged capacity of a battery without bringing the battery to the fully-charged state or the fully-discharged state.

A fully-charged battery capacity detection method according to the present invention includes a capacity variation detection step, an open-circuit voltage detection step, a remaining capacity determination step, a remaining capacity variation rate calculation step, and a fully-charged capacity calculation step. In the capacity variation detection step, a capacity variation value ($\delta$Ah) of a battery is calculated based on the integrated values of charging and discharging currents of the battery to be charged/discharged between first detection timing and second detection timing. In the open-circuit voltage detection step, first and second open-circuit voltages (VOCV1, VOCV2) of the battery are detected at the first detection timing and the second detection timing, respectively. In the remaining capacity determination step, first and second remaining capacities (SOC1 [%], SOC2 [%]) of the battery are determined based on the first and second open-circuit voltages (VOCV1, VOCV2) that are detected in the open-circuit voltage detection step, respectively. In the remaining capacity variation rate calculation step, a remaining capacity variation rate ($\delta$S [%]) is calculated based on the difference between the first and second remaining capacities (SOC1 [%], SOC2 [%]) that are determined in the remaining capacity determination step. In the fully-charged capacity calculation step, a fully-charged capacity (Ahf) of the battery is calculated based on the remaining capacity variation rate (δS [%]) and the capacity change value (δAh) by the following formula $$Ahf = \delta Ah/(\delta S/100)$$

This method has a feature in that can accurately detect the fully-charged capacity of a battery without bringing the battery to the fully-charged state or the fully-discharged state. The reason is that the method calculates a capacity variation value (δAh) of a battery based on the integrated value of charging and discharging currents of the battery to be charged/discharged between first detection timing and second detection timing; detects first and second open-circuit voltages (VOCV1, VOCV2) of the battery at the first detection timing and the second detection timing, respectively; determines first and second remaining capacities (SOC1 [%], SOC2 [%]) of the battery based on the detected first and second open-circuit voltages (VOCV1, VOCV2); calculates a remaining capacity variation rate (δS [%]) based on the difference between the first and second remaining capacities (SOC1 [%], SOC2 [%]) that are determined in the remaining capacity determination step; and calculates a fully-charged capacity (Ahf) of the battery based on the remaining capacity variation rate (δS [%]) and the capacity change value (δAh).

In addition to this, since the method can accurately calculate the fully-charged capacity (Ahf) of the battery, it is also possible to accurately determine the deterioration degree of the battery based on the detected fully-charged capacity (Ahf).

In the fully-charged battery capacity detection method according to the present invention, the battery can be a battery that is installed in a vehicle. In this fully-charged battery capacity detection method, the first detection timing is predetermined timing in that an ignition switch is turned ON, and in that a load current of the battery is cut off. In addition to this, the second detection timing is a point after the ignition switch is turned OFF.

In this fully-charged battery capacity detection method, the fully-charged capacity of the battery can be detected every vehicle running operation.

In the fully-charged battery capacity detection method according to the present invention, a time interval between the first detection timing and the second detection timing can be constant.

In this fully-charged battery capacity detection method, the fully-charged capacity of the battery can be accurately detected every period in that the constant time interval elapses.

In the fully-charged battery capacity detection method according to the present invention, the second detection timing can be timing in that the capacity variation value (δAh) becomes a predetermined value after the first detection timing.

In this fully-charged battery capacity detection method, since the second detection timing is timing in that the capacity variation value (δAh) becomes a predetermined value after the first detection timing, the method has a feature that can accurately detect the fully-charged capacity of the battery. The reason is that, since the capacity variation value (δAh) and the remaining capacity variation rate (δS [%]) are certain values, the fully-charged capacity can be detected in the state where the error of measurement is small.

In the fully-charged battery capacity detection method according to the present invention, the battery can be a lithium-ion rechargeable battery or a lithium-polymer battery.

In this fully-charged battery capacity detection method, the battery is a lithium-ion rechargeable battery or a lithium-polymer battery. The voltage variation of this type of the battery is large with respect to the remaining capacity (SOC [%]). In this method, the remaining capacity (SOC [%]) is accurately detected based on the open-circuit voltage (VOCV). Therefore, it is possible to accurately detect the fully-charged capacity.

In the fully-charged battery capacity detection method according to the present invention, the first and second remaining capacities (SOC1 [%], SOC2 [%]) of the battery can be determined based on the first and second open-circuit voltages (VOCV1, VOCV2), respectively, by a stored function or table.

In this fully-charged battery capacity detection method, since the first and second remaining capacities (SOC1 [%], SOC2 [%]) of the battery are determined based on the first and second open-circuit voltages (VOCV1, VOCV2), respectively, by the stored function or table, the remaining capacities (SOC [%]) are accurately detected based on the open-circuit voltages (VOCV), and it is possible to accurately detect the fully-charged capacity.

The above and further objects of the present invention as well as the features thereof will become more apparent from the following detailed description to be made in conjunction with the accompanying drawings.

DETAILED DESCRIPTION OF THE PREFERRED EMBODIMENT(S)

Figure 1:
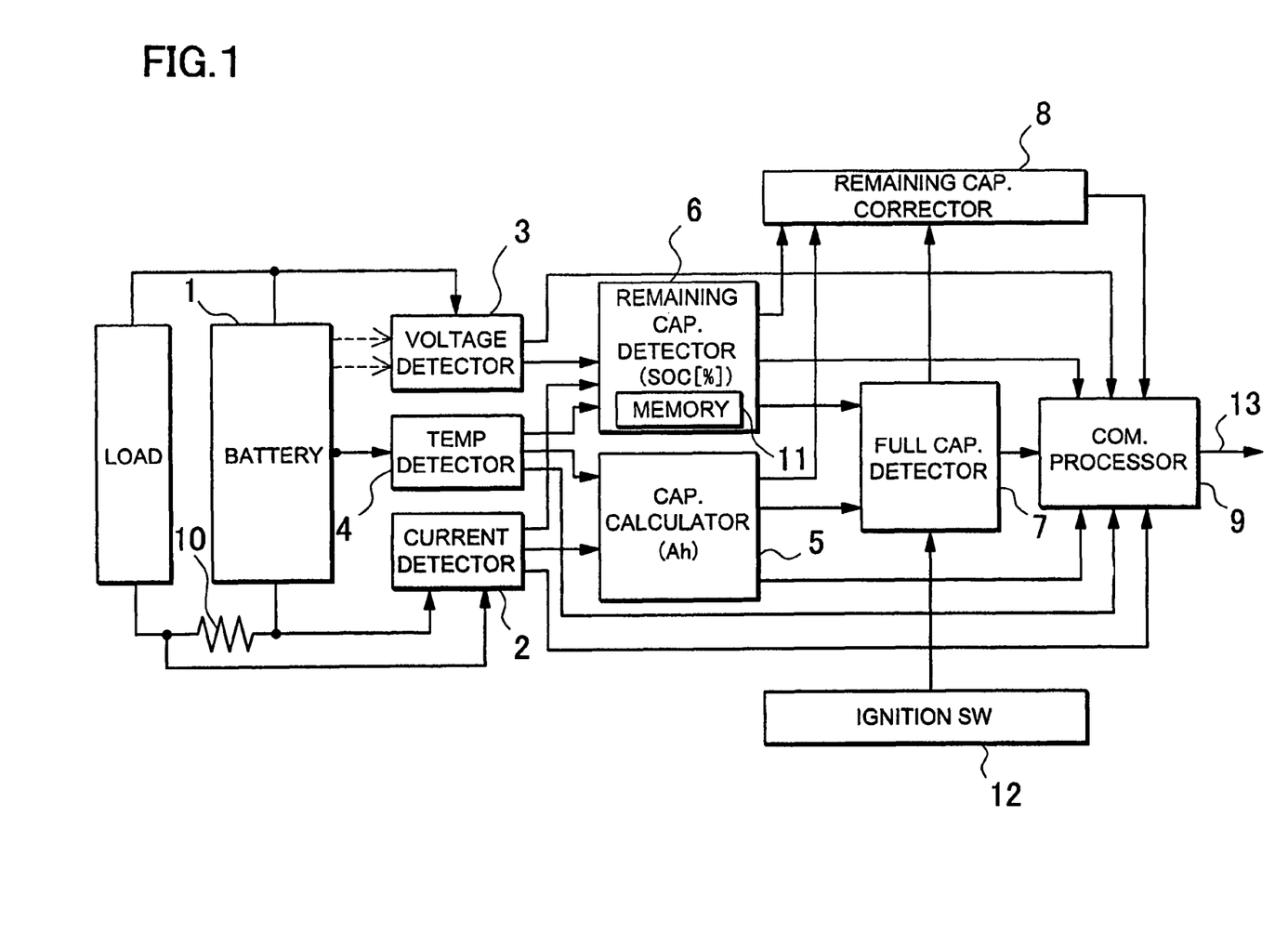
FIG. 1 is a circuit diagram of a vehicle power supply device that is used in a fully-charged battery capacity detection method according to one embodiment of the present invention.

FIG. 1 is a circuit diagram of a vehicle power supply device that is used in a fully-charged battery capacity detection method according to the present invention. This power supply device includes a rechargeable battery 1, a current detection portion 2, a voltage detection portion 3, a temperature detection portion 4, a capacity calculation portion 5, a remaining capacity detection portion 6, a fully-charged capacity detection portion 7, a remaining capacity correction circuit 8, and a communication processing portion 9. The current detection portion 2 detects the charging/discharging currents of the battery 1. The voltage detection portion 3 detects the voltage of the battery 1. The temperature detection portion 4 detects the temperature of the battery 1. The capacity calculation portion 5 calculates the output signals of the current detection portion 2 and integrates the charging/discharging currents of the battery 1 to detect the capacity (Ah) of the battery 1. The remaining capacity detection portion 6 determines the remaining capacity (SOC [%]) of the battery 1 based on the output signals of the voltage detection portion 3. The fully-charged capacity detection portion 7 detects the fully-charged capacity of the battery 1 based on the output signals of the remaining capacity detection portion 6 and the capacity calculation portion 5. The remaining capacity correction circuit 8 corrects the remaining capacity (SOC [%]) of the battery 1 based on the fully-charged capacity that is detected by the fully-charged capacity detection portion 7, and detects an accurate remaining capacity (SOC [%]). The communications processing portion 9 sends information to an apparatus that uses the battery 1 as its power supply.

The battery 1 is a lithium-ion rechargeable battery or a lithium-polymer battery. However, any rechargeable batteries such as nickel-hydrogen and nickel-cadmium batteries can be used as the battery. The battery 1 includes one battery section or a plurality of battery sections that are connected in series or in parallel.

The current detection portion 2 that detects the charging/discharging currents of the battery 1 detects a voltage that is generated between the both ends of the current detection resistor 10 that is connected to the battery 1 in series, and detects the charging current and the discharge current. The current detection portion 2 amplifies the voltage that is generated between the both ends of the current detection resistor 10 by means of an amplifier (not shown). The current detection portion 2 converts an analog signal of output signal of the amplifier into a digital signal by means of an A/D converter (not shown), and provides the digital signal. In the current detection resistor 10, a voltage is generated proportional to a current that flows in the battery 1. Accordingly, the current can be detected based on the voltage. The amplifier is an operational amplifier that can amplify ±signals. Charging/discharge currents can be recognized based on the ±signals of output voltage. The current detection portion 2 provides current signals of the battery 1 to the capacity calculation portion 5, the remaining capacity detection portion 6, and the communication processing portion 9.

The voltage detection portion 3 detects the voltage of the battery 1. The voltage detection portion 3 converts the detected analog signal into a digital signal by means of an A/D converter (not shown), and provides the digital signal. The voltage detection portion 3 provides the detected voltage signal of the battery 1 to the remaining capacity detection portion 6 and the communication processing portion 9. In the case of a power supply device that includes a plurality of battery cells in series, the respective voltages of the battery cells can be detected, and the average value of the voltages can be provided. In the case of a power supply device that includes a plurality of serially-connected battery modules each of which includes serially-connected battery cells, the average value of the voltages of the battery modules is provided as battery voltage.

The temperature detection portion 4 detects the temperature of the battery 1. The temperature detection portion 4 converts the detected signal into a digital signal by means of an A/D converter (not shown), and provides the digital signal. The temperature detection portion 4 provides temperature signals to the capacity calculation portion 5, the remaining capacity detection portion 6, and the communication processing portion 9.

The capacity calculation portion 5 calculates the current signals of the digital signals that are provided from the current detection portion 2, and calculates the capacity (Ah) of the battery 1. The capacity calculation portion 5 subtracts a discharging capacity from a charging capacity of the battery 1, and calculates the capacity (Ah) of the battery 1 as an integrated current value (Ah). The charged capacity is calculated as an integrated value of charging currents of the battery 1, or is calculated by multiplying the integrated value by a charging efficiency value. The discharging capacity is calculated as an integrated value of discharging currents. The capacity calculation portion 5 corrects the integrated value of the charging capacity and the discharging capacity based on the signals that are provided from the temperature detection portion 4, and can accurately calculate the capacity.

Figure 2:
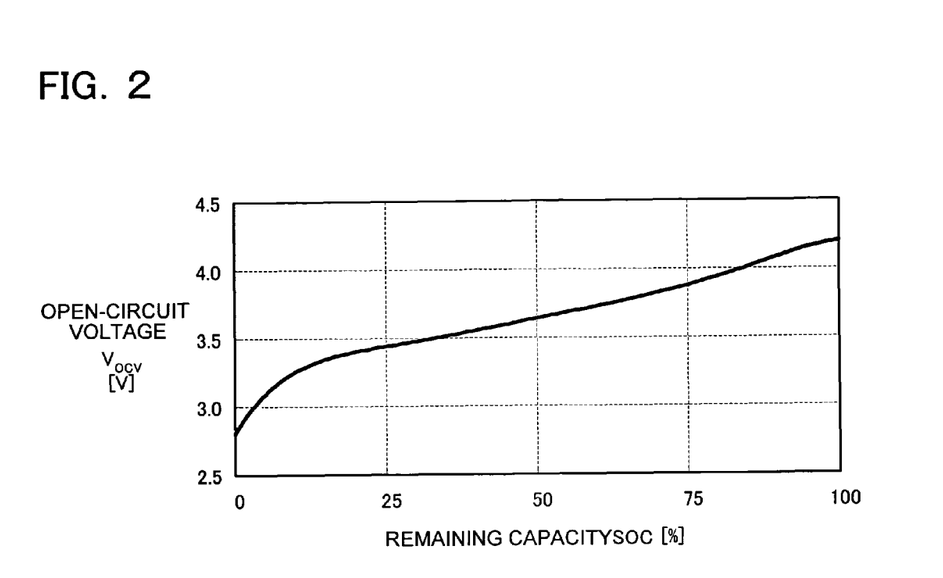
FIG. 2 is a graph showing the characteristic between remaining capacity and open-circuit voltage of a battery.

The remaining capacity detection portion 6 determines the remaining capacity (SOC [%]) of the battery 1 based on an open-circuit voltage (VOCV) of the battery 1. The remaining capacity detection portion 6 detects the open-circuit voltage (VOCV) of the battery 1 based on the voltage signal of the battery 1 that is provided from the voltage detection portion 3, and the current signal that is provided from the current detection portion 2. The remaining capacity detection portion 6 detects the voltage value that is provided from the voltage detection portion 3 as the open-circuit voltage (VOCV) at timing in that a charging/discharging current value that is provided from the current detection portion 2 becomes 0. In order to determine the remaining capacity (SOC [%]) of the battery 1 based on the open-circuit voltage (VOCV) of the detected battery 1, the remaining capacity detection portion 6 stores a function or table of the remaining capacity (SOC [%]) with respect to the open-circuit voltage (VOCV) of the battery 1 in the memory 11. FIG. 2 is a graph showing the remaining capacity (SOC [%]) against the open-circuit voltage (VOCV) of the battery. The memory 11 stores the characteristic between the open-circuit voltage and the remaining capacity shown in the graph as the function or table. The remaining capacity detection portion 6 determines the remaining capacity (SOC [%]) with respect to the open-circuit voltage (VOCV) based on the function or table that is stored in the memory 11.

Figure 3:
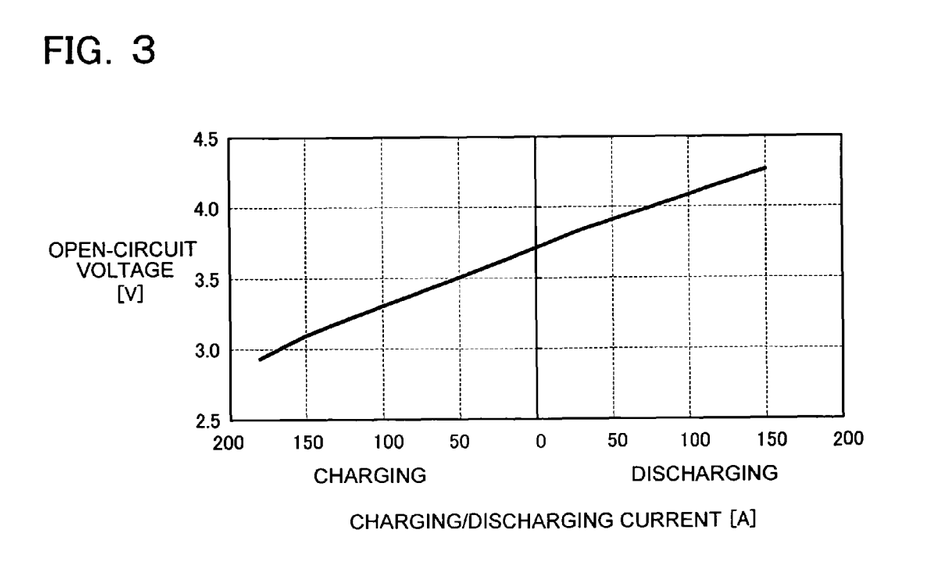
FIG. 3 is a graph showing the characteristic between charging/discharging current and open-circuit voltage of the battery.

The remaining capacity detection portion 6 does not necessarily detect the open-circuit voltage (VOCV) at timing in that the charging/discharging current becomes 0. The remaining capacity detection portion 6 may detect the open-circuit voltage (VOCV) of the battery 1 by calculation based on the charging/discharging currents of the battery 1 that is detected by the current detection portion 2. The remaining capacity detection portion 6 stores the open-circuit voltage (VOCV) with respect to the charging/discharging current of the battery 1 as the function or table in the memory 11. FIG. 3 is a graph showing the open-circuit voltage (VOCV) of the battery with respect to the charging/discharging current of the battery. The memory 11 stores a function or table of the characteristic between the current and the open-circuit voltage shown in the graph. The remaining capacity detection portion 6 calculates the open-circuit voltage (VOCV) with respect to the charging/discharging current based on the function or table that is stored in the memory 11. The remaining capacity detection portion 6 determines the remaining capacity (SOC [%]) of the battery 1 based on the calculated open-circuit voltage (VOCV). Irrespective of the charging/discharging operation states of the battery 1, in other words, even in the case where a charging or discharging current flows in the battery 1, the remaining capacity detection portion 6 can detect the open-circuit voltage (VOCV) of the battery 1.

The fully-charged capacity detection portion 7 detects the fully-charged capacity (Ahf) of the battery 1 by the following formula based on the variation of the remaining capacity (SOC [%]) of the battery 1 that is detected by the remaining capacity detection portion 6 (i.e., the variation rate (δS [%]) of the remaining capacity (SOC [%]), and the variation of the capacity (Ah) of the battery 1 that is detected by the capacity calculation portion 5 (i.e., the capacity variation value (δAh))

$$Ahf = \delta Ah/(\delta S/100)$$

The capacity (Ah) and the remaining capacity (SOC [%]) of the battery 1 vary when the battery 1 is charged/discharged. The capacity (Ah) and the remaining capacity (SOC [%]) of the battery decrease when the battery is discharged. The capacity (Ah) and the remaining capacity (SOC [%]) of the battery increase when the battery is charged. The capacity (Ah) of the battery that varies is detected by the capacity calculation portion 5. The capacity calculation portion 5 integrates the charging and discharge currents of the battery 1, and calculates the capacity (Ah). The remaining capacity (SOC [%]) of the battery that varies is detected by the remaining capacity detection portion 6. The remaining capacity detection portion 6 determines the remaining capacity (SOC [%]) based on the voltage of the battery 1.

The capacity calculation portion 5 detects the capacity (Ah) of the battery that varies. The remaining capacity detection portion 6 detects the remaining capacity (SOC [%]) of the battery that varies. The fully-charged capacity detection portion 7 calculates the fully-charged capacity (Ahf) based on the capacity variation value (δAh) of the battery that varies and the variation rate (δS [%]) of the remaining capacity. In order to detect the capacity variation value (δAh) of the battery 1 and the variation rate (δS [%]) of the remaining capacity, the fully-charged capacity detection portion 7 calculates the capacity variation value (δAh) and the variation rate (δS [%]) of remaining capacity of the battery 1 that is charged/discharged between first detection timing and second detection timing.

Figure 4:
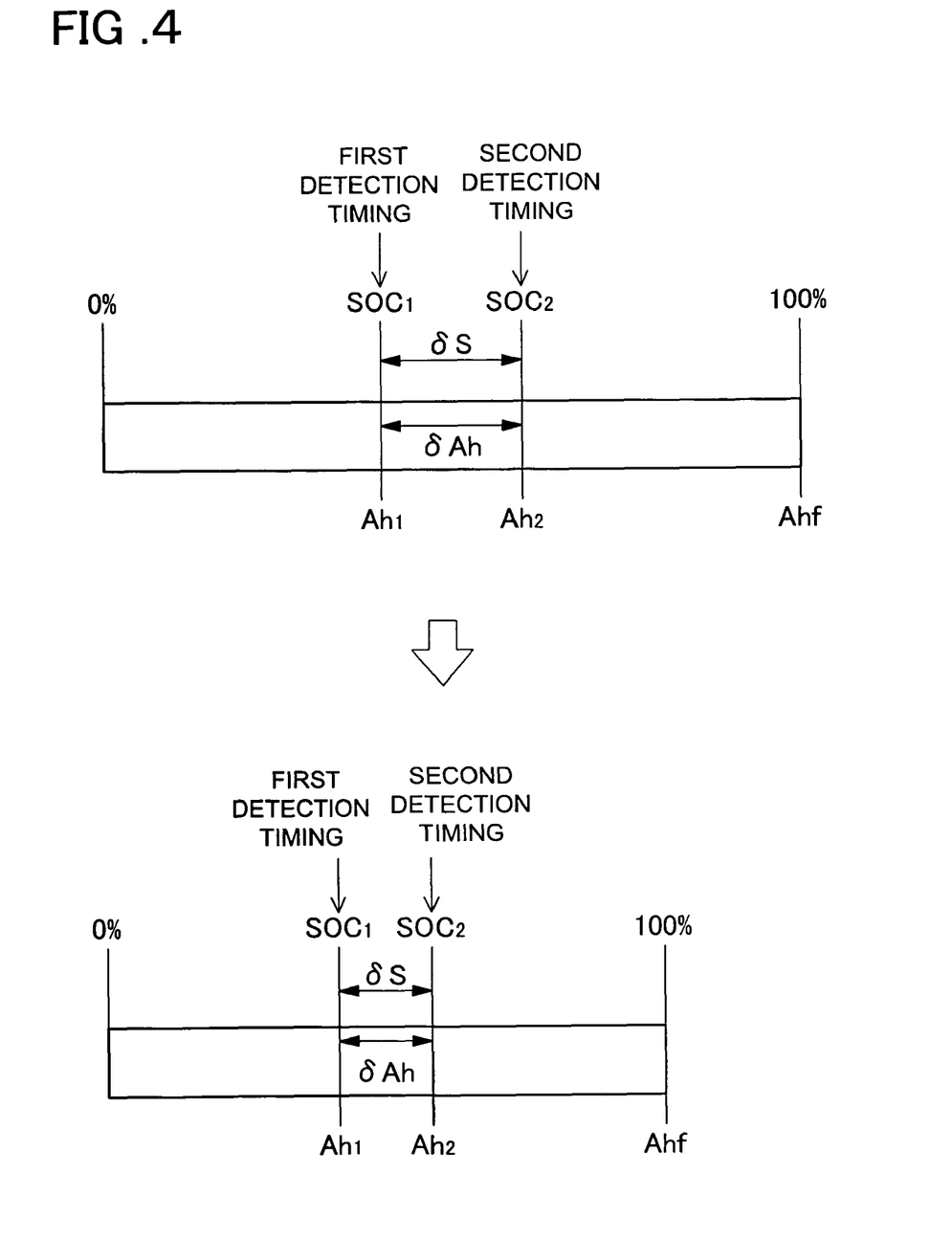
FIG. 4 is a view schematically showing the fully-charged battery capacity detection method according to the embodiment of the present invention.

As shown in FIG. 4, the fully-charged capacity detection portion 7 calculates the capacity variation value (δAh) based on the difference between first and second capacities (Ah1, Ah2) of the battery that are detected at the first detection timing and the second detection timing, respectively. Alternatively, the fully-charged capacity detection portion 7 calculates the capacity variation value (δAh) based on the integrated value of the charging/discharging currents from the first detection timing to the second detection timing. Also, the fully-charged capacity detection portion 7 calculates the variation rate (δS [%]) of the remaining capacity based on the difference between the remaining capacity (SOC1 [%]) that is detected at the first detection timing and the remaining capacity (SOC2 [%]) that is detected at the second detection timing.

In the case of a vehicle power supply device, the first detection timing is predetermined timing in that an ignition switch 12 is turned ON, and in that a load current of the battery 1 is cut off. The second detection timing is a point after the ignition switch 12 is turned OFF. The first detection timing can be a point in a predetermined range between points before and after the ignition switch 12 is turned ON, for example, between a point two hours before the ignition switch 12 is turned ON and a point three seconds (preferably one second) after the ignition switch 12 is turned ON. In the case where the first detection timing is a point before the ignition switch 12 is turned ON, the first detection timing can be the latest detection timing in that the voltage detection portion 3 detects the voltage of the battery 1. In this case, the first open-circuit voltage (VOCV1) is the battery voltage that is detected at the latest detection timing and is stored in the memory 11. The second detection timing is a point after the ignition switch is turned OFF, and at the point the voltage of the battery 1 will be stable. For example, the second detection timing is a point two hours after the ignition switch 12 is turned OFF. However, a time interval between the first detection timing and the second detection timing may be a fixed time interval (e.g., time interval of several minutes to several hours). Alternatively, the second detection timing may be after the first detection timing, and be timing in that the capacity variation value (δAh) becomes a predetermined value (e.g., 10% of the rated capacity). In the aforementioned method that calculates the open-circuit voltage (VOCV) based on the charging/discharging current values and determines the remaining capacity (SOC [%]), the first detection timing and the second detection timing are not limited to timing in that the charging or discharging current of the battery 1 is 0, but can be any timing.

The remaining capacity correction circuit 8 corrects the remaining capacity (SOC [%]) of the battery 1 based on the fully-charged capacity (Ahf) of the battery 1 that is detected by the fully-charged capacity detection portion 7, and detects the remaining capacity (SOC [%]) of the battery 1. That is, the remaining capacity correction circuit 8 corrects the remaining capacity (SOC [%]) by the following formula based on the fully-charged capacity (Ahf) of the battery 1 that is detected by the fully-charged capacity detection portion 7 and the capacity (Ah) of the battery 1 that is calculated by the capacity calculation portion 5.

$$\text{Remaining Capacity}(SOC\ [\%]) = [\text{Capacity}(Ah)/\text{Fully-Charged Capacity}(Ahf)] \times 100$$

The remaining capacity correction circuit 8 accurately detects the remaining capacity of the battery 1 based on both the remaining capacity (SOC [%]) of the battery 1 that is calculated by the formula and the remaining capacity (SOC [%]) that is detected based on the battery voltage by the remaining capacity detection portion 6. For example, the remaining capacity correction circuit 8 calculates the average of the remaining capacity (SOC [%]) that is calculated based on the fully-charged capacity (Ahf) and the capacity (Ah), and the remaining capacity (SOC [%]) that is determined based on the battery voltage. Thus, the remaining capacity correction circuit 8 calculates the accurate remaining capacity (SOC [%]) of the battery 1. Alternatively, based on the battery voltage and the remaining capacity (SOC [%]), the remaining capacity correction circuit 8 assigns weight to the remaining capacity (SOC [%]) that is calculated based on the fully-charged capacity (Ahf) and the capacity (Ah), and the remaining capacity (SOC [%]) that is determined based on the battery voltage, and calculates the average of the remaining capacity (SOC [%]) that is calculated based on the fully-charged capacity (Ahf) and the capacity (Ah), and the remaining capacity (SOC [%]) that is determined based on the battery voltage. Thus, the remaining capacity correction circuit 8 calculate the accurate remaining capacity (SOC [%]) of the battery 1.

The communication processing portion 9 sends battery information through a communication line 13 to the apparatus that includes the power supply device. The battery information includes the remaining capacity (SOC [%]) that is detected by the remaining capacity correction circuit 8, the fully-charged capacity (Ahf) that is detected by the fully-charged capacity detection portion 7, the remaining capacity (SOC [%]) that is detected by the remaining capacity detection portion 6, the battery voltage that is detected by the voltage detection portion 3, the current value that is detected by the current detection portion 2, the temperature that is detected by the temperature detection portion 4, and the like.

The power supply device may determine the deterioration degree of the battery 1 based on the calculated fully-charged capacity (Ahf). In this case, the power supply device determines the deterioration degree of the battery 1 based on the reduction degree of the calculated fully-charged capacity (Ahf) relative to the rated capacity (Ahs) of the battery. The power supply device stores a function or table to detect the deterioration degree of the battery based on the fully-charged capacity (Ahf) or the ratio of the fully-charged capacity relative to rated capacity (Ahf/Ahs) of the battery. The power supply device detects the deterioration degree of the battery based on the stored function or table.

The aforementioned power supply device detects the fully-charged capacity of the battery by using the following processes.

(Capacity Variation Detection Process)

The fully-charged capacity detection portion 7 calculates the capacity variation value ($\delta$Ah) of the battery based on the integrated value of charging and discharging currents of the battery to be charged/discharged between the first detection timing and second detection timing.

In this process, the fully-charged capacity detection portion 7 calculates the capacity variation value ($\delta$Ah) based on the difference between first and second capacities (Ah1, Ah2) of the battery that are detected by the capacity calculation portion 5 at the first detection timing and the second detection timing, respectively. Alternatively, the fully-charged capacity detection portion 7 detects the capacity variation value ($\delta$Ah) that is calculated by the capacity calculation portion 5 as the integrated value of the charging/discharging currents from the first detection timing to the second detection timing.

(Open-Circuit Voltage Detection Process)

The remaining capacity detection portion 6 detects the first and second open-circuit voltages (VOCV1, VOCV2) of the battery 1 at the first detection timing and the second detection timing, respectively. The remaining capacity detection portion 6 detects the open-circuit voltage (VOCV) at timing in that the charging/discharging current becomes 0, or detects the open-circuit voltage (VOCV) of the battery 1 by calculation based on the charging/discharging current.

(Remaining Capacity Determination Process)

The remaining capacity detection portion 6 determines first and second remaining capacities (SOC1 [%], SOC2 [%]) of the battery 1 based on the first and second open voltages (VOCV1, VOCV2) that are detected in the open-circuit voltage detection process, respectively. The remaining capacity detection portion 6 determines the remaining capacity (SOC [%]) of the battery 1 with respect to the open-circuit voltage (VOCV) based on the function or table that is stored in the memory 11.

(Remaining Capacity Variation Rate Calculation Process)

The fully-charged capacity detection portion 7 calculates the remaining capacity variation rate ($\delta$S [%]) based on the difference between the first and second remaining capacities (SOC1 [%], SOC2 [%]) that are determined in the remaining capacity determination process.

(Fully-Charged Capacity Calculation Process)

The fully-charged capacity detection portion 7 calculates the fully-charged capacity (Ahf) of the battery 1 based on the capacity variation value ($\delta$Ah) that is detected in the capacity variation detection process, and the variation rate ($\delta$S [%]) of the remaining capacity that is calculated in the remaining capacity variation rate calculation process by the following formula $$Ahf = \delta Ah / (\delta S / 100)$$

Figure 5:
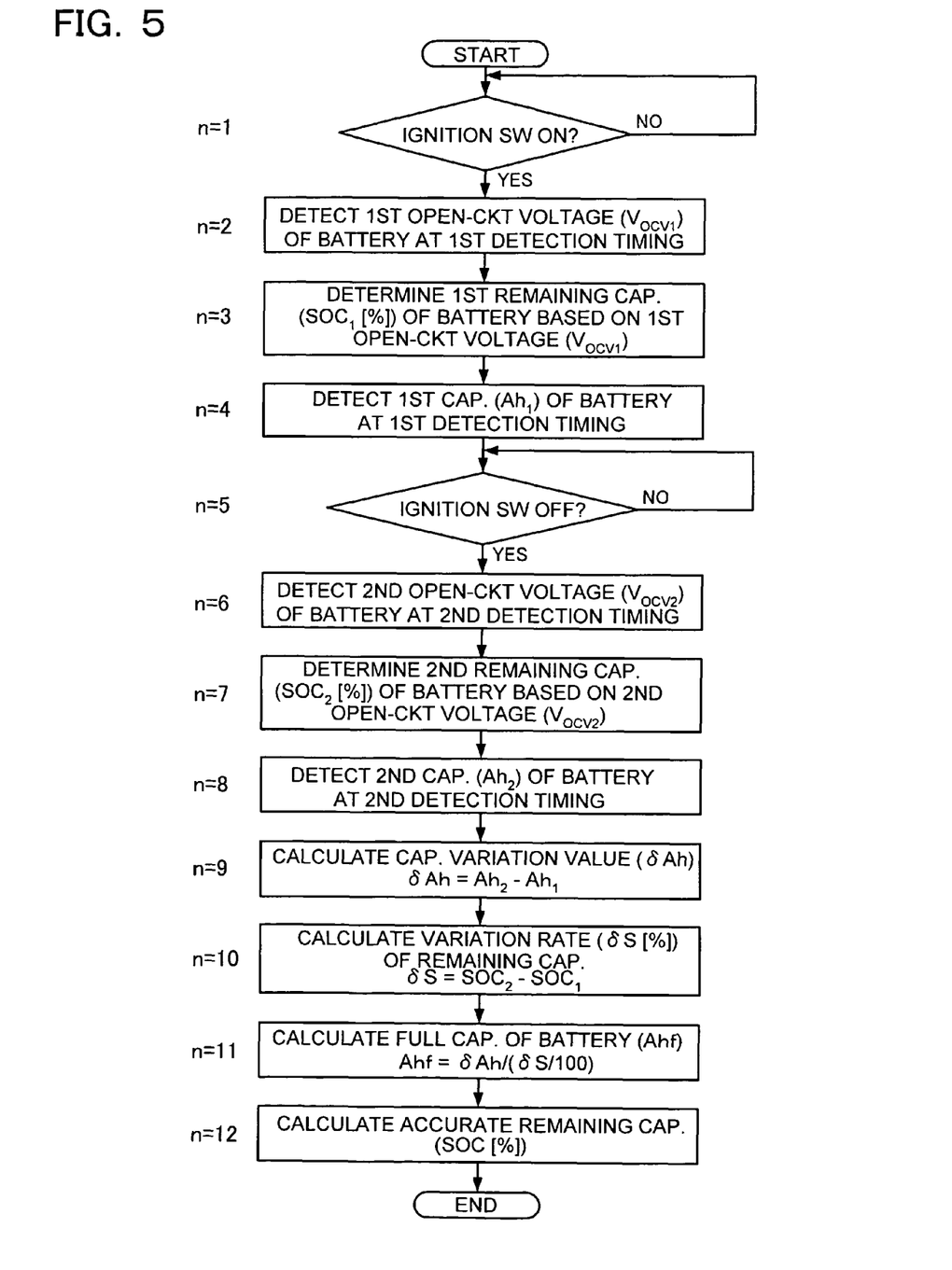
FIG. 5 is a flowchart showing the fully-charged battery capacity detection method according to the embodiment of the present invention.

With reference to FIG. 5, the aforementioned power supply device detects the fully-charged capacity of the battery by using the following steps.

(Step n=1)

It is determined whether the ignition switch 12 is turned ON. This step is repeatedly executed until the ignition switch 12 is turned ON.

(Step n=2)

If the ignition switch 12 is turned ON, at timing in that a load current of the battery is first cut off after the ignition switch 12 is turned ON (the first timing), the remaining capacity detection portion 6 detects the first open-circuit voltage (VOCV1) of the battery 1.

(Step n=3)

The remaining capacity detection portion 6 determines the first remaining capacity (SOC1 [%]) of the battery 1 based on the detected first open-circuit voltage (VOCV1) by using the function or table.

(Step n=4)

The fully-charged capacity detection portion 7 detects the first capacity (Ah1) of the battery 1 at the first detection timing. For example, the fully-charged capacity detection portion 7 multiplies the fully-charged capacity (Ahf) of the battery 1 that is detected at the latest detection timing by the first remaining capacity (SOC1 [%]) of the battery 1 that is determined in Step n=3, and thus can calculate and detect the first capacity (Ah1) of the battery 1.

(Step n=5)

It is determined whether the ignition switch 12 is turned OFF. This step is repeatedly executed until the ignition switch 12 is turned OFF.

(Step n=6)

If the ignition switch 12 is turned OFF, at timing in that a predetermined time interval elapses (the second timing) after the ignition switch 12 is turned OFF, the remaining capacity detection portion 6 detects the second open-circuit voltage (VOCV2) of the battery 1.

(Step n=7)

The remaining capacity detection portion 6 determines the second remaining capacity (SOC2 [%]) of the battery 1 based on the detected second open-circuit voltage (VOCV2) by using the function or table.

(Step n=8)

The fully-charged capacity detection portion 7 detects the second capacity (Ah2) of the battery 1 at the second detection timing. The second capacity (Ah2) of the battery 1 is calculated by the capacity calculation portion 5 based on the integrated value of the charging and discharge currents of the battery 1 to be charged/discharged.

(Step n=9)

The fully-charged capacity detection portion 7 calculates the capacity variation value ($\delta$Ah) based on the difference between the first capacity (Ah1) of the battery 1 at the first detection timing and the second capacity (Ah2) of the battery 1 at the second detection timing.

(Step n=10)

The fully-charged capacity detection portion 7 calculates the remaining capacity variation rate ($\delta$S [%]) based on the difference between the first and second remaining capacities (SOC1 [%], SOC2 [%]) of the battery 1.

(Step n=11)

The fully-charged capacity detection portion 7 calculates the fully-charged capacity of the battery 1 based on the calculated capacity variation value (δAh) and the calculated variation rate (δS [%]) of the remaining capacity by the following formula $$Ahf = \delta Ah/(\delta S/100)$$

(Step n=12)

The remaining capacity correction circuit 8 calculates the remaining capacity (SOC [%]) based on the capacity (Ah) that is detected by the capacity calculation portion 5 relative to the fully-charged capacity (Ahf) of the battery 1 that is detected by the fully-charged capacity detection portion 7. The accurate remaining capacity (SOC [%]) of the battery 1 is accurately calculated based on both the calculated remaining capacity (SOC [%]) and the remaining capacity (SOC [%]) that is detected based on the battery voltage by the remaining capacity detection portion 6.

Figure 6:
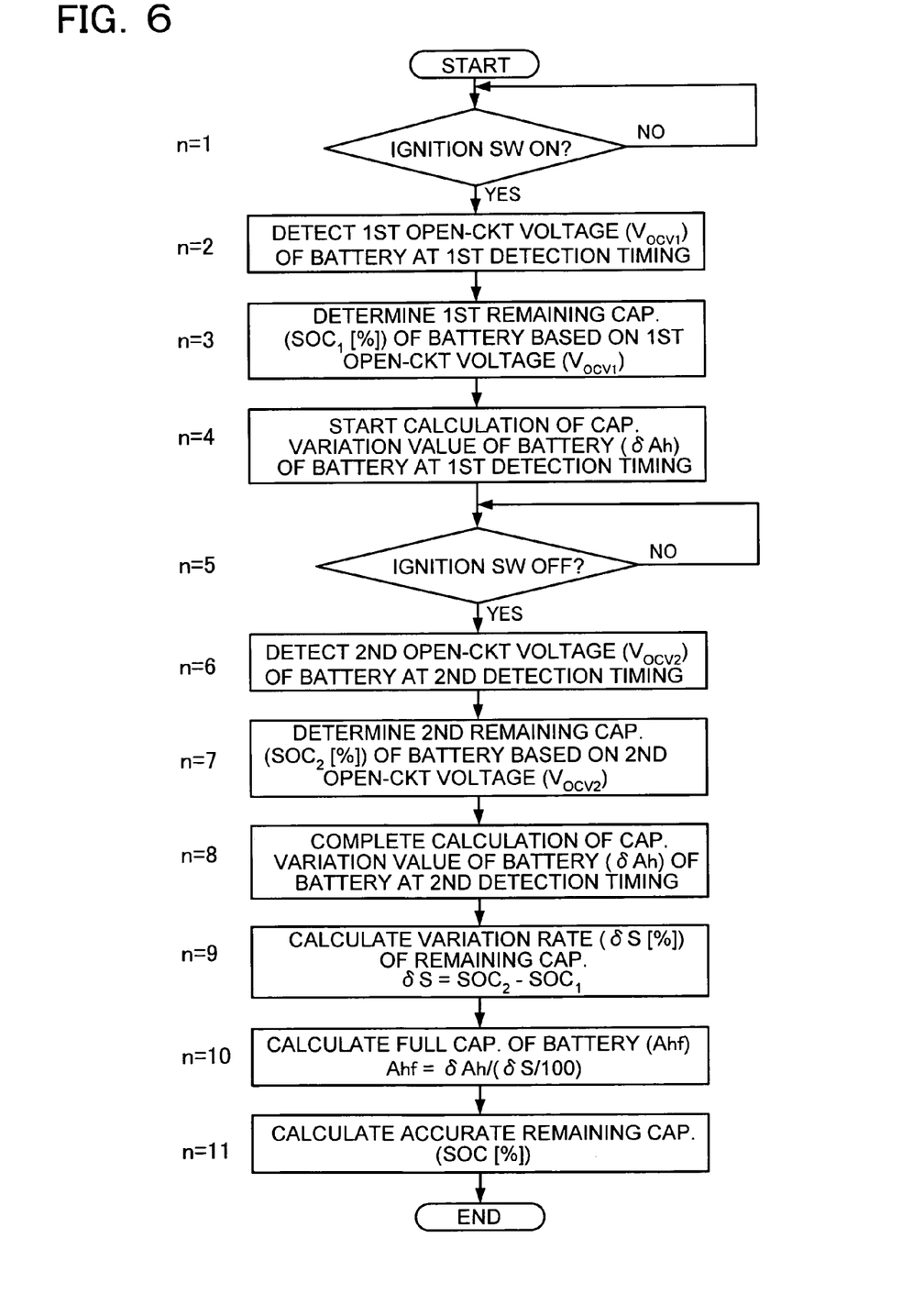
FIG. 6 is a flowchart showing a fully-charged battery capacity detection method according to another embodiment of the present invention.

The power supply device can detect the fully-charged capacity of the battery by using the following steps with reference to FIG. 6.

(Step n=1)

It is determined whether the ignition switch 12 is turned ON. This step is repeatedly executed until the ignition switch 12 is turned ON.

(Step n=2)

If the ignition switch 12 is turned ON, at timing in that a load current of the battery is first cut off after the ignition switch 12 is turned ON (the first timing), the remaining capacity detection portion 6 detects the first open-circuit voltage (VOCV1) of the battery 1.

(Step n=3)

The remaining capacity detection portion 6 determines the first remaining capacity (SOC1 [%]) of the battery 1 based on the detected first open-circuit voltage (VOCV1) by using the function or table.

(Step n=4)

The capacity calculation portion 5 starts the calculation of the capacity variation value (δAh) of the battery 1 at the first detection timing. The capacity calculation portion 5 integrates the charging and discharge currents of the battery 1 to be charged/discharged, and calculates the variation value of the capacity (Ah).

(Step n=5)

It is determined whether the ignition switch 12 is turned OFF. This step is repeatedly executed until the ignition switch 12 is turned OFF.

(Step n=6)

If the ignition switch 12 is turned OFF, at timing in that a predetermined time interval elapses (the second timing) after the ignition switch 12 is turned OFF, the remaining capacity detection portion 6 detects the second open-circuit voltage (VOCV2) of the battery 1.

(Step n=7)

The remaining capacity detection portion 6 determines the second remaining capacity (SOC2 [%]) of the battery 1 based on the detected second open-circuit voltage (VOCV2) by using the function or table.

(Step n=8)

The capacity calculation portion 5 completes the calculation of the capacity variation value (δAh) of the battery 1 at the second detection timing. The capacity calculation portion 5 provides the fully-charged capacity detection portion 7 with the capacity (Ah) that is calculated based on the integrated value of the charging and discharge currents of the battery 1 to be charged/discharged between the first detection timing and the second detection timing as the capacity variation value (δAh).

(Step n=9)

The fully-charged capacity detection portion 7 calculates the remaining capacity variation rate (δS [%]) based on the difference between the first and second remaining capacities (SOC1 [%], SOC2 [%]) of the battery 1.

(Step n=10)

The fully-charged capacity detection portion 7 calculates the fully-charged capacity of the battery 1 based on the calculated capacity variation value (δAh) and the calculated variation rate (δS [%]) of the remaining capacity by the following formula $$Ahf = \delta Ah/(\delta S/100)$$

(Step n=11)

The remaining capacity correction circuit 8 calculates the remaining capacity (SOC [%]) based on the capacity (Ah) that is detected by the capacity calculation portion 5 relative to the fully-charged capacity (Ahf) of the battery 1 that is detected by the fully-charged capacity detection portion 7. The accurate remaining capacity (SOC [%]) of the battery 1 is calculated based on both the calculated remaining capacity (SOC [%]) and the remaining capacity (SOC [%]) that is detected based on the battery voltage by the remaining capacity detection portion 6.

Although the first detection timing is timing immediately after the ignition switch 12 is turned ON in the aforementioned method, the first detection timing may be timing immediately before the ignition switch 12 is turned ON. The aforementioned method calculates the fully-charged capacity of the battery 1 and thus can accurately detect the remaining capacity (SOC [%]) every when the ignition switch 12 is turned ON and is then turned OFF, in other words every vehicle running operation.

Figure 7:
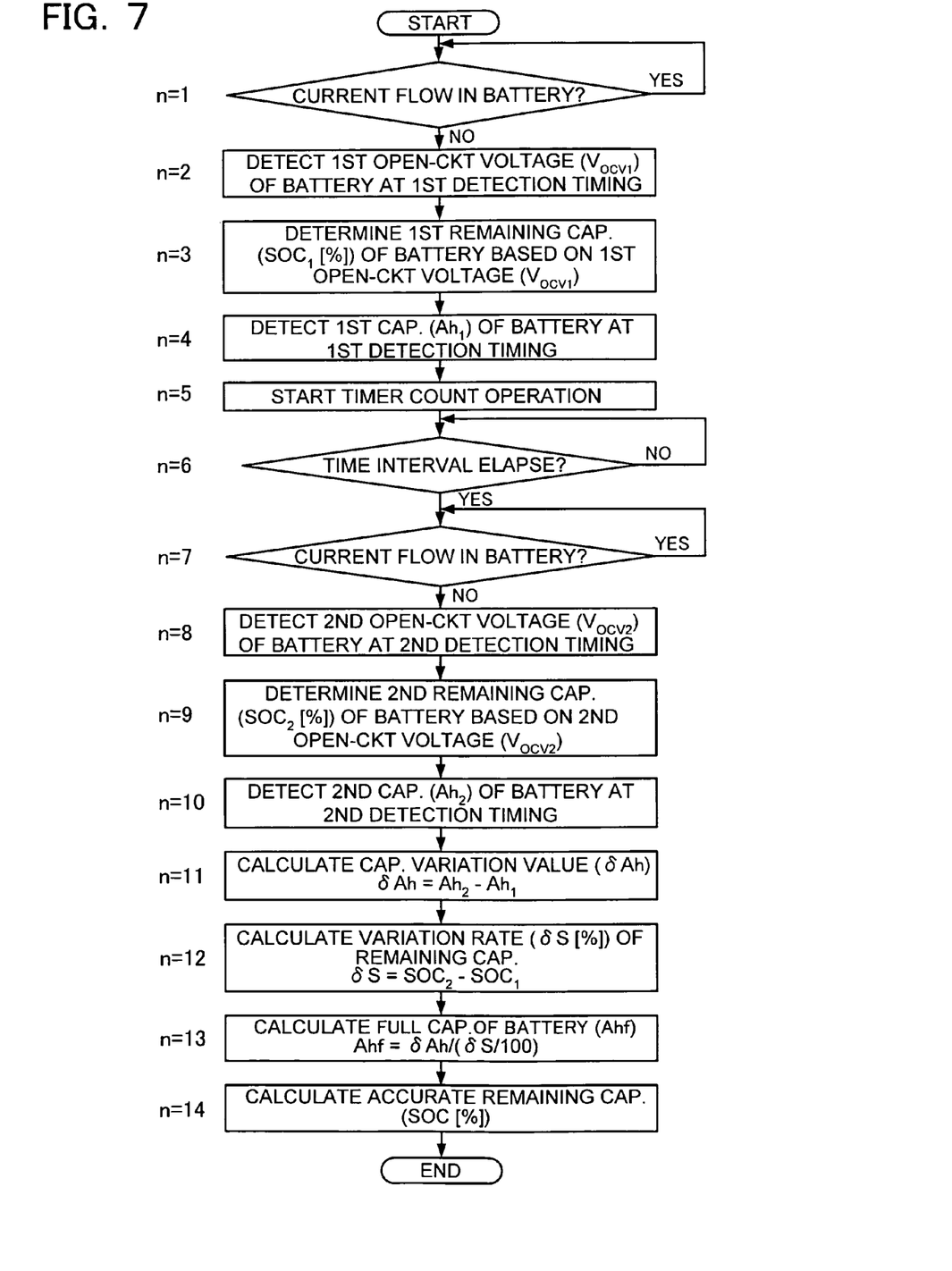
FIG. 7 is a flowchart showing a fully-charged battery capacity detection method according to another embodiment of the present invention.

With reference to FIG. 7, the power supply device can detect the fully-charged capacity of the battery by using the following steps.

(Steps n=1 and 2)

It is detected whether a current flows in the battery 1. The first detection timing is timing when the state where a current does not flow in the battery 1 is detected. The remaining capacity detection portion 6 detects the first open-circuit voltage (VOCV1) of the battery 1 at this timing. An example of the state where a current does not flow in the battery 1 is provided by the state where the vehicle stops to wait at traffic lights.

(Step n=3)

The remaining capacity detection portion 6 determines the first remaining capacity (SOC1 [%]) of the battery 1 based on the detected first open-circuit voltage (VOCV1) by using the function or table.

(Step n=4)

The fully-charged capacity detection portion 7 detects the first capacity (Ah1) of the battery 1 at the first detection timing. The capacity calculation portion 5 integrates the charging and discharge currents of the battery 1 to be charged/discharged, and calculates the first capacity (Ah1) of the battery 1.

(Steps n=5 and 6)

A timer (not shown) starts count operation at the first detection timing. The timer stores a time interval between the first detection timing and the second detection timing. If the stored time interval elapses, the count operation ends.

(Steps n=7 and 8)

If the stored time interval elapses, it is detected whether a current flows in the battery 1. The second detection timing is timing when the state where a current does not flow in the battery 1 is detected. The remaining capacity detection portion 6 detects the second open-circuit voltage (VOCV2) of the battery 1 at this timing.

(Step n=9)

The remaining capacity detection portion 6 determines the second remaining capacity (SOC2 [%]) of the battery 1 based on the detected second open-circuit voltage (VOCV2) by using the function or table.

(Step n=10)

The fully-charged capacity detection portion 7 detects the second capacity (Ah2) of the battery 1 at the second detection timing. The capacity calculation portion 5 integrates the charging/discharging currents of the battery 1, and calculates the second capacity (Ah2) of the battery 1.

(Step n=11)

The fully-charged capacity detection portion 7 calculates the capacity variation value (δAh) based on the difference between the first capacity (Ah1) of the battery 1 at the first detection timing and the second capacity (Ah2) of the battery 1 at the second detection timing.

(Step n=12)

The fully-charged capacity detection portion 7 calculates the remaining capacity variation rate (δS [%]) based on the difference between the first and second remaining capacities (SOC1 [%], SOC2 [%]) of the battery 1.

(Step n=13)

The fully-charged capacity detection portion 7 calculates the fully-charged capacity of the battery 1 based on the calculated capacity variation value (δAh) and the calculated variation rate (δS [%]) of the remaining capacity by the following formula $$Ahf = \delta Ah / (\delta S / 100)$$

(Step n=14)

The remaining capacity correction circuit 8 calculates the remaining capacity (SOC [%]) based on the capacity (Ah) that is detected by the capacity calculation portion 5 relative to the fully-charged capacity (Ahf) of the battery 1 that is detected by the fully-charged capacity detection portion 7. The accurate remaining capacity (SOC [%]) of the battery 1 is calculated based on both the calculated remaining capacity (SOC [%]) and the remaining capacity (SOC [%]) that is detected based on the battery voltage by the remaining capacity detection portion 6.

Figure 8:
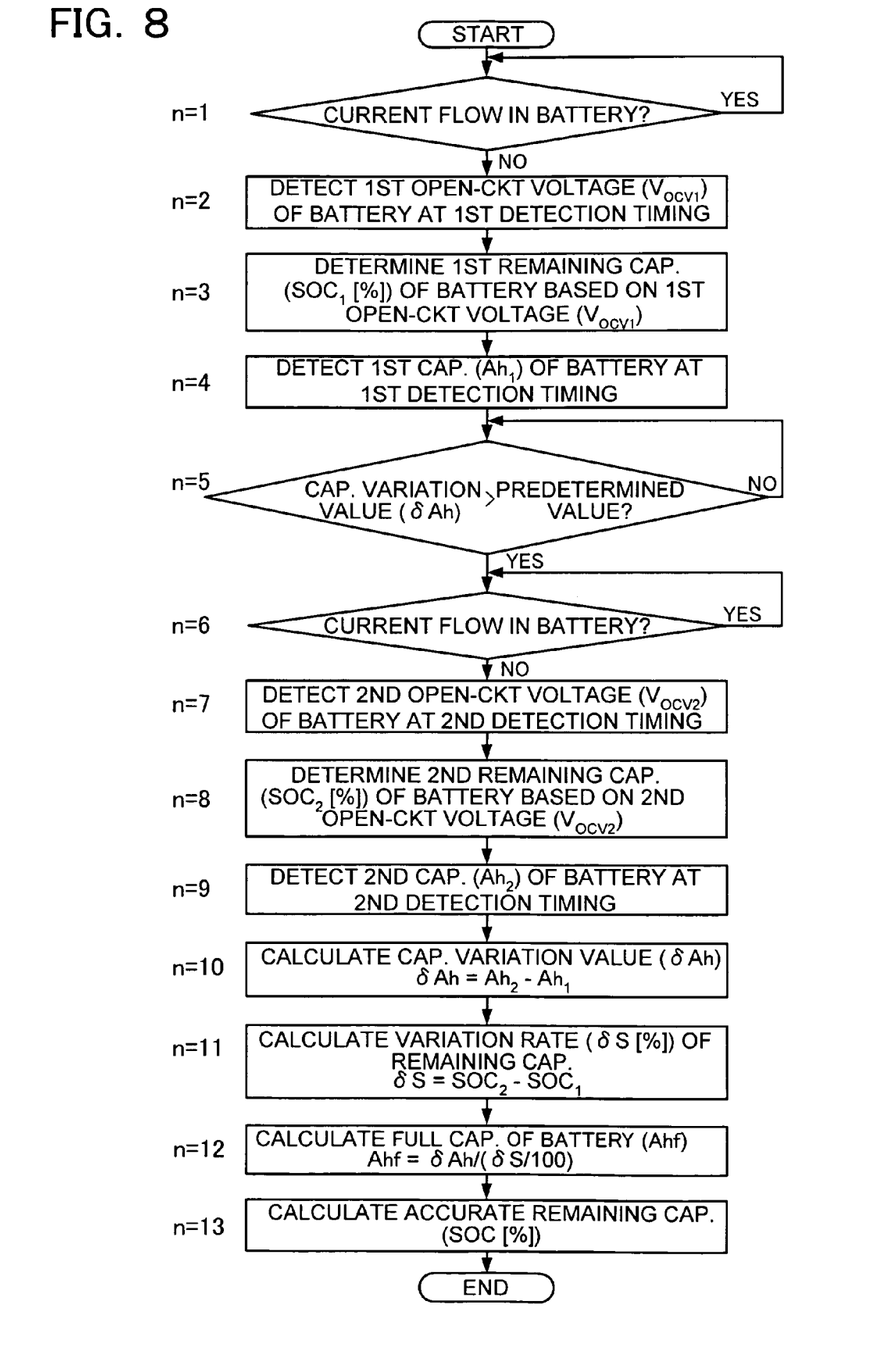
FIG. 8 is a flowchart showing a fully-charged battery capacity detection method according to still another embodiment of the present invention.

The power supply device can detect the fully-charged capacity of the battery by using the following steps with reference to FIG. 8.

(Steps n=1 and 2)

It is detected whether a current flows in the battery 1. The first detection timing is timing when the state where a current does not flow in the battery 1 is detected. The remaining capacity detection portion 6 detects the first open-circuit voltage (VOCV1) of the battery 1 at this timing. An example of the state where a current does not flow in the battery 1 is provided by the state where the vehicle stops to wait at traffic lights.

(Step n=3)

The remaining capacity detection portion 6 determines the first remaining capacity (SOC1 [%]) of the battery 1 based on the detected first open-circuit voltage (VOCV1) by using the function or table.

(Step n=4)

The fully-charged capacity detection portion 7 detects the first capacity (Ah1) of the battery 1 at the first detection timing. The capacity calculation portion 5 integrates the charging and discharge currents of the battery 1 to be charged/discharged, and calculates the first capacity (Ah1) of the battery.

(Steps n=5 to 7)

It is determined whether the variation of the capacity (Ah) of the battery relative to the first capacity (Ah1) of the battery at first detection timing exceeds a predetermined capacity. If the capacity variation value (δAh) of the battery 1 becomes larger than the predetermined value, it is detected whether a current flows in the battery 1. The second detection timing is timing when the state where a current does not flow in the battery 1 is detected. The remaining capacity detection portion 6 detects the second open-circuit voltage (VOCV2) of the battery 1 at this timing.

(Step n=8)

The remaining capacity detection portion 6 determines the second remaining capacity (SOC2 [%]) of the battery 1 based on the detected second open-circuit voltage (VOCV2) by using the function or table.

(Step n=9)

The fully-charged capacity detection portion 7 detects the second capacity (Ah2) of the battery 1 at the second detection timing. The capacity calculation portion 5 integrates the charging/discharging currents of the battery 1, and calculates the second capacity (Ah2) of the battery 1.

(Step n=10)

The fully-charged capacity detection portion 7 calculates the capacity variation value (δAh) based on the difference between the first capacity (Ah1) of the battery 1 at the first detection timing and the second capacity (Ah2) of the battery 1 at the second detection timing.

(Step n=11)

The fully-charged capacity detection portion 7 calculates the remaining capacity variation rate (δS [%]) based on the difference between the first and second remaining capacities (SOC1 [%], SOC2 [%]) of the battery 1.

(Step n=12)

The fully-charged capacity detection portion 7 calculates the fully-charged capacity of the battery 1 based on the calculated capacity variation value (δAh) and the calculated variation rate (δS [%]) of the remaining capacity by the following formula $$Ahf = \delta Ah / (\delta S / 100)$$

(Step n=13)

The remaining capacity correction circuit 8 calculates the remaining capacity (SOC [%]) based on the capacity (Ah) that is detected by the capacity calculation portion 5 relative to the fully-charged capacity (Ahf) of the battery 1 that is detected by the fully-charged capacity detection portion 7. The accurate remaining capacity (SOC [%]) of the battery 1 is calculated based on both the calculated remaining capacity (SOC [%]) and the remaining capacity (SOC [%]) that is detected based on the battery voltage by the remaining capacity detection portion 6.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims. The present application is based on Application No. 2007-79952 filed in Japan on Mar. 26, 2007, the content of which is incorporated herein by reference.

What is claimed is:

1. A fully-charged battery capacity detection method of a battery, the method comprising:
    calculating a capacity variation value of a battery based on an integrated value of charging and discharging currents of the battery to be charged/discharged between a first detection timing and a second detection timing;
    detecting first and second open-circuit voltages of the battery at the first detection timing and the second detection timing, respectively;
    determining first and second remaining capacities of the battery based on the first and second open-circuit voltages detected;
    calculating a remaining capacity variation rate based on a difference between the first and second remaining capacities determined;
    calculating a fully-charged capacity of the battery based on the remaining capacity variation rate and the capacity change value by the following formula:

$Ahf=\delta Ah/(\delta S/100)$;

and
    transmitting, using a communication processing portion, information including a remaining capacity of the battery determined to an external device that is supplied power from the battery.

2. The fully-charged battery capacity detection method according to claim 1, further comprising:
    correcting, using a remaining capacity correction circuit, a remaining capacity of the battery based on the fully-charged capacity of the battery calculated, and detecting an accurate remaining capacity of the battery.

3. The fully-charged battery capacity detection method according to claim 1, wherein the battery is installed in a vehicle, wherein the first detection timing is a predetermined timing based on when an ignition switch is turned ON, and a load current of the battery is cut off.

4. The fully-charged battery capacity detection method according to claim 3, wherein the first detection timing is in a range between two hours before the ignition switch is turned ON and three seconds after the ignition switch is turned ON.

5. The fully-charged battery capacity detection method according to claim 1, wherein the battery is installed in a vehicle, wherein the second detection timing is a point after the ignition switch is turned OFF.

6. The fully-charged battery capacity detection method according to claim 5, wherein the second detection timing is a point after which the ignition switch is turned OFF, and the voltage of the battery is stable.

7. The fully-charged battery capacity detection method according to claim 1, wherein the battery is installed in a vehicle, wherein the first detection timing is a predetermined timing in-that based on when an ignition switch is turned ON, and a load current of the battery is cut off, the second detection timing being a point after the ignition switch is turned OFF.

8. The fully-charged battery capacity detection method according to claim 1, wherein a time interval between the first detection timing and the second detection timing is constant.

9. The fully-charged battery capacity detection method according to claim 1, wherein the second detection timing is based on when the capacity variation value becomes a predetermined value after the first detection timing.

10. The fully-charged battery capacity detection method according to claim 1, wherein the battery is a lithium-ion rechargeable battery or a lithium-polymer battery.

11. The fully-charged battery capacity detection method according to claim 1, wherein the first and second remaining capacities of the battery are determined based on the first and second open-circuit voltages, respectively, using a stored function.

12. The fully-charged battery capacity detection method according to claim 1, wherein the first and second remaining capacities of the battery are determined based on the first and second open-circuit voltages, respectively, by referring to a stored table.

13. The fully-charged battery capacity detection method according to claim 1, wherein the open-circuit voltages of the battery are calculated and detected based on the charging/discharging current of the battery.

14. The fully-charged battery capacity detection method according to claim 13, wherein a function of open-circuit voltages related to charging/discharging current of the battery is stored in a memory, and a remaining capacity detection portion calculates an open-circuit voltage of the battery with respect to the charging/discharging current of the battery and the function that is stored in the memory, the charging/discharging current being detected by a current detection portion.

15. The fully-charged battery capacity detection method according to claim 13, wherein a table of open-circuit voltages related to charging/discharging current of the battery is stored in a memory, and a remaining capacity detection portion calculates an open-circuit voltage of the battery based on the charging/discharging current of the battery and the table of open-circuit voltages stored in the memory, the charging/discharging current being detected by a current detection portion.

* * * * *